United States Patent [19]
Gruber et al.

[11] Patent Number: 4,996,585
[45] Date of Patent: Feb. 26, 1991

[54] ELECTRONIC PACKAGE

[75] Inventors: Harald Gruber, Herrenberg; Kurt Hinrichsmeyer, Sindelfingen; Heinz G. Horbach, Gechingen; Ewald E. Stadler, Herrenberg, all of Fed. Rep. of Germany

[73] Assignee: International Business Machines Corporation, Armonk, N.Y.

[21] Appl. No.: 381,334

[22] Filed: Jul. 18, 1989

[30] Foreign Application Priority Data

Jul. 20, 1988 [DE] Fed. Rep. of Germany ....... 3824654

[51] Int. Cl.$^5$ .......................... G11C 5/04; H01L 23/02
[52] U.S. Cl. .......................................... 357/74; 357/80
[58] Field of Search .................................... 357/74, 80

[56] References Cited

U.S. PATENT DOCUMENTS

| | | | |
|---|---|---|---|
| 3,877,064 | 4/1975 | Scheingold et al. | 357/74 |
| 4,126,882 | 11/1978 | Carson et al. | 357/74 |
| 4,377,854 | 3/1983 | Braun et al. | 365/2 |
| 4,420,877 | 12/1983 | McKenzie, Jr. | 29/739 |
| 4,742,024 | 5/1988 | Sugimoto et al. | 29/739 |
| 4,916,523 | 4/1990 | Sokolovsky et al. | 357/74 |

OTHER PUBLICATIONS

"Silicon-on-Silicon Packaging", R. K. Spielberger et al.; IEEE, vol. CHMT-7, No. 2, Jun. 1984, pp. 193-196.
"Compact Low Profile VLSI IC Package", A. R. Gresko, IBM Technical Disclosure Bulletin, vol. 24, No. 12, May, 1982, pp. 6388-6389.

Primary Examiner—Andrew J. James
Assistant Examiner—Viet Q. Nguyen
Attorney, Agent, or Firm—Lawrence R. Fraley; Norman R. Bardales

[57] ABSTRACT

An electronic package (11) which comprises a substrate (12) having several chips (13) arranged thereon, and a plurality of connector pins (26) fitted in pin plates (21-24) and electrically connected via conductors to the chips (13). Each pin plate is mounted by means of at least one flexible connector element (29) connected to the conductors at a respective peripheral section (16-19) of the substrate (12). The pin plates have a base surface in the form of any discretionary polygon, in such a manner that, when folded, form a plane substantially flush with the plane of the substrate (12) into a position beneath the substrate (12), or vice versa. Thus an electronic package is obtained which is less complex in its manufacture and covers a considerably reduced base surface while offering a comparable performance.

8 Claims, 2 Drawing Sheets

ELECTRONIC PACKAGE

BACKGROUND OF THE INVENTION

The present invention relates to an electronic package, also known as "module".

In such a package or module, e.g., such as described in IEEE Transactions on Components, Hybrids and Manufacturing Technology, Vol. CHMT-7, No. 2, p. 193 ff, June 1984, a silicon substrate equipped with a plurality of chips comprising integrated circuits is placed roughly centrally on a bigger ceramic plate. This ceramic plate contains in its border section the connector pins connected via conductive lines on the ceramic plate to the chip contact points on the silicon substrate.

The manufacture of such a module is relatively complex, as it consists of a plurality of parts which originally are separate units and have subsequently to be interconnected, not only because the substrate carrying the chips and the plate with the connector pins have to be made separately in individual product lines, but also because it is a relatively complex process to insert the connector pins in the ceramic plate and/or to bring the conductive lines through the ceramic plate to the connector pins. Another disadvantage of such a package structure is that, owing to the arrangement and the necessary spacing of the connector pins relative to each other, the module base surface is much larger than required for the necessary base surface of the chips that occupy the substrate. Thus, the packing density of the chips that are to be provided on a plug-in card is not determined by their base surface but by the packing density of the connector pins which is roughly ten times higher. Furthermore, due to the above mentioned difficulty of placing the conductive lines on the chip-covered substrate surface the connector pins cannot be provided directly beneath the chips.

A package or module, respectively, of the above specified type is also known from IBM Technical Disclosure Bulletin Vol. 24, No. 12, page 6388 ff., May 1982. With this module, the chips are provided on a silicon substrate placed on a mechanically fixed interposer having on its lower side the pin carrier plate. For electrically connecting the chips to the connector pins, a multi-strand cable is provided which extends from parallel conductors arranged in the edge section of the silicon substrate round the lateral edge of the interposer and between the lower side of the interposer and the opposite surface of the pin carrier plate to the individual back ends of the connector pins protruding through the pin carrier plate.

Although with such an arrangement of the conductors between the chips and the connector pins the conductors no longer have to be arranged in a complex design through a carrier plate or similar element, with the lower chip surfaces being equally designed for holding connector pins, there still is a discrepancy between the base surface required for the chips and the module base surface required for the connector pins. Furthermore, the individual components have also to be made and subsequently assembled in separate production lines.

Another disadvantage of the two above specified known packages is that these can only be tested after the assembly of the individual components, which means that for the elimination of potential minor defects, these cannot be disassembled without being demolished. The same applies to future module defects during operation.

It is therefore an object of the present invention to provide an electronic package or module of the above specified type which is less complex in manufacture and which, with the same or comparable performance, requires a much reduced surface area.

SUMMARY OF THE INVENTION

In accordance with one aspect of the invention, there is defined an electronic package which comprises a substantially planar substrate having a plurality of conductors located thereon, a plurality of integrated circuit chips on the planar substrate and electrically and mechanically connected to conductors located on the substrate, a plurality of pin members each including an electrically insulating material having a plurality of connector pins therein, each of the pin plate members being foldable with respect to one of the sides of the substrate, a plurality of connector elements each electrically coupling a respective one of the pin plate members to the integrated circuit chips, and at least one base plate member defining a recess therein for receiving the integrated circuit chips and a plurality of openings each designed for accommodating a respective one of the conductor pins. The planar substrate is of a first predetermined shape while the plurality of pin plate members are each of a preestablished shape different than that of the substrate such that the pin plate members combine to form a shape substantially identical in configuration and size as the planar substrate when the pin plate members occupy the folded position with respect to the planar substrate. Such a folded arrangement is made possible through the use of connector elements which are of flexible nature.

BRIEF DESCRIPTION OF THE DRAWINGS

Further details of the invention are specified in the following description, where the invention is described and specified in detail with reference to the embodiment shown in the drawings. The Figures depict the following.

BEST MODE FOR CARRYING OUT THE INVENTION

Figure 1:
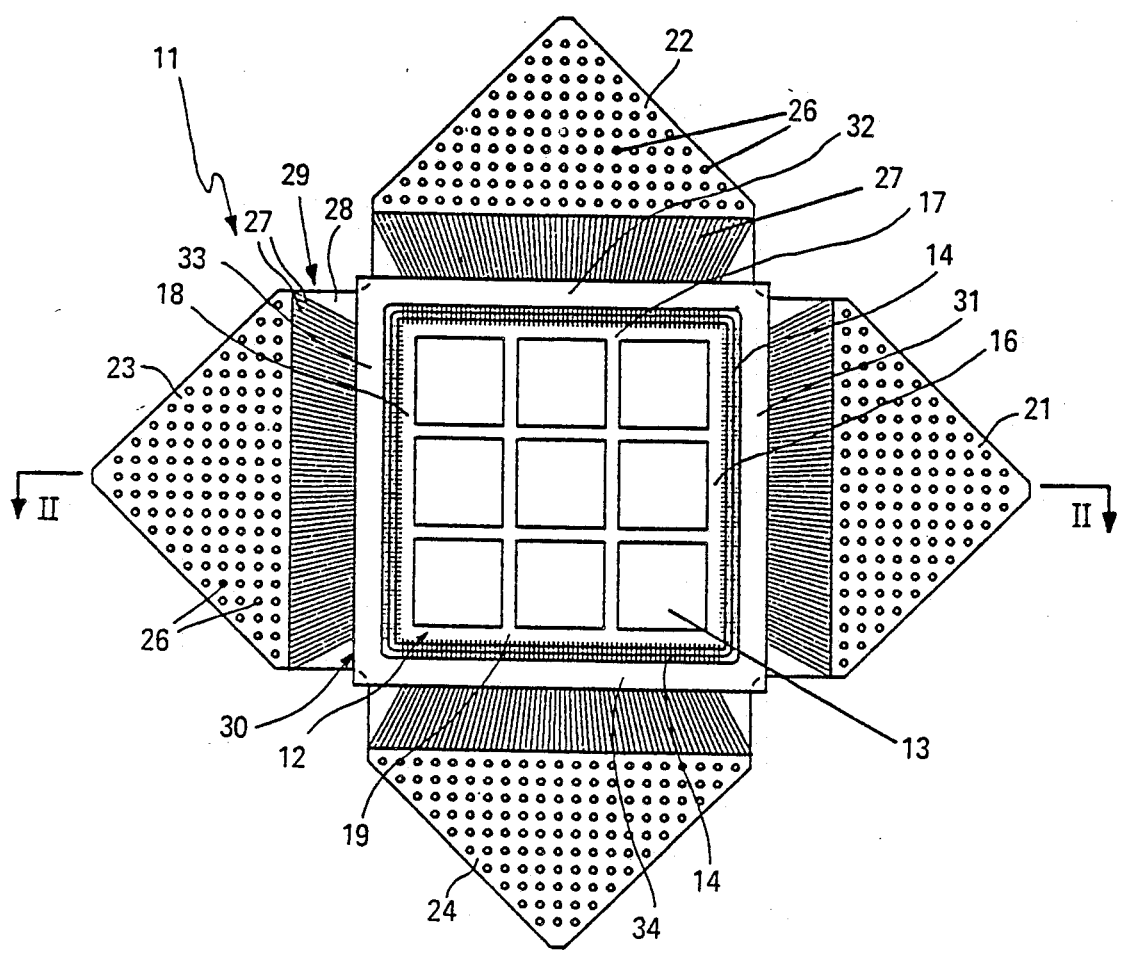
FIG. 1 is a bottom view of a module in its unfolded initial state immediately after manufacture, according to a preferred embodiment of the present invention.

The electronic package 11 which in the following will also be called a module comprises a substrate 12 with chips 13 arranged in flip-chip mode and comprising several integrated circuits. In the present embodiment, substrate 12, which represents the chip carrier, is a square silicon plate. It is equipped with a multitude of, e.g., printed conductors (not shown) which are correspondingly distributed over the surface of substrate 12 facing the chips 13, and which lead to each of the peripheral sections 16 to 19 of substrate 12. Chips 13 are connected electrically and mechanically in flip-chip mode by means of solder balls (not shown) to the corresponding conductors (not shown) on substrate 12. In the depicted embodiment, nine spaced chips 13 are provided on substrate 12 (see FIG. 2).

In a manner not shown, substrate 12 can be a conductor-personalized, chips-receiving plate, i.e. a plate that is individualized with respect to the conductors.

Opposite each of the peripheral sections 16 to 19 (see FIG. 1) pin plates 21 to 24 are provided at a distance and fitted with a multitude of connector pins 26 distributed substantially evenly over the entire surface. Pin plates 21 to 24 consist of an electrically insulating material, i.e. a synthetic material and are mechanically substantially rigid.

Each one of pin plates 21 to 24 is connected to the respectively opposite peripheral section 16 to 19 of substrate 12 via a connector element 29 comprising electrical conductors 27 and a flexible carrier 28. Conductors 27 are electrically insulated relative to each other within flexible carrier 28 and are electrically connected at one end at 14 with the corresponding conductors of substrate 12, e.g. by thermocompression, and at the other end, not shown, to a respective one of the connector pins 26. In this manner, an electric connection is created between pin plates 21 to 24 and chips 13 on substrate 12, said connection being flexible from a mechanical point of view.

According to a variation (not shown), it is possible to design pin plate or plates 21 to 24 and connector element or elements 29 and flexible carrier 28 as one unit with a synthetic layer of substrate 12 comprising insulated conductors, said unit receiving within the substrate 12 area on one side chips 13 and being on the other side electrically connected to the substrate.

In the embodiment, pin plates 21 to 24 are of identical design and of a triangular shape, the total base surface of which roughly corresponds to that of substrate 12. In other words, the assembled triangular pin plates 21 to 24 form a square corresponding to the base surface of substrate 12. The mechanical flexible and electric connection between the pin plates and substrate 12 is established in the depicted embodiment by a flat cable. Obviously, other electrically conductive and mechanically flexible connections can also be used.

Figure 2:
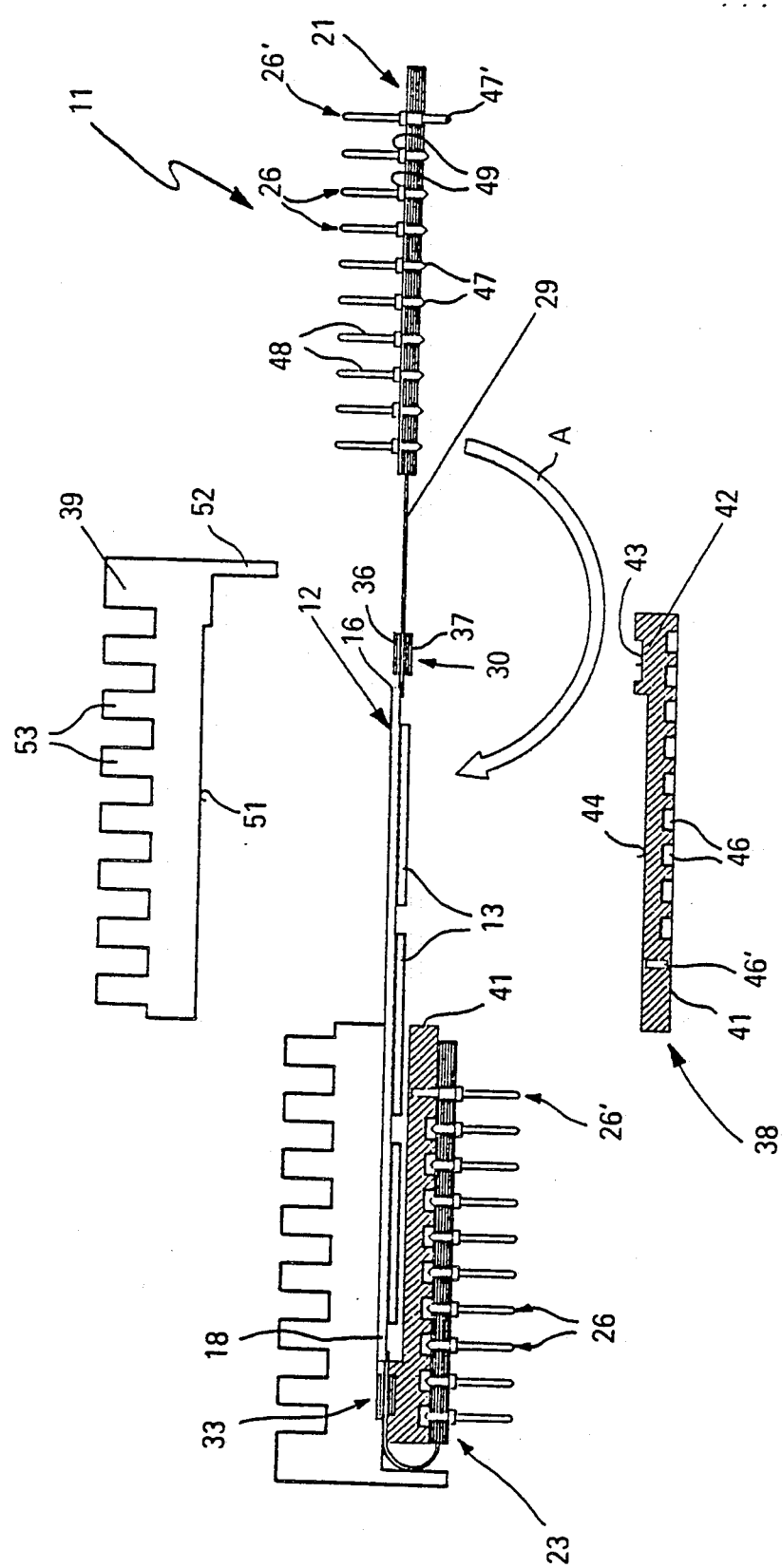
FIG. 2 is a section view taken along line II—II of FIG. 1, with the module in the right-hand part being represented in its unfolded initial state, and in the left-hand part in its final state achieved through a folding movement and through the addition of two mechanically relevant components.

In the unfolded initial state represented in FIG. 1 and in the right-hand part of FIG. 2, module 11 is composed of its individual components, or the module components are respectively equipped accordingly. In this initial state, pin plates 21 to 24 are roughly in one plane with substrate 12.

According to FIG. 1, a traction relief frame 30 is provided whose individual frame legs 31 to 34 consist of an upper and lower bar 36, 37 between which the respective connector element is clamped. Traction relief frame 30 is arranged at a constant but small spacing round substrate 12.

According to FIG. 2, module 11 is shifted by means of two further components 38 and 39 from its unfolded initial state depicted at the right side into a final state shown at the left in that pin plates 21 to 24 are folded upward in accordance with FIG. 1 and downward in accordance with FIG. 2 (in accordance with arrow A) over or under substrate 12, respectively.

Component 38 is formed by a base plate 41 that may consist of one or several parts and be of square or triangular shape. In its outer border section 42, base plate 41 has a groove 43 into which fits the lower part 37 of the respective leg 31 to 34 of traction relief frame 30. Furthermore, base plate 41 comprises a recess 44 extending from border section 42 radially inwards which receives chips 13 arranged on substrate 12 when traction relief frame 30 rests on base plate 41 and the latter is practically covered by substrate 12. Facing away from recess 44 and groove 43, base plate 41 shows a plurality of blind borings 46 receiving those ends 47 of connector pins 26 which slightly protrude from the back of pin plate 21-24.

Ends 48 of connector pins 26 protruding from pin plate 21 to 24 and showing an annular rim 49 between the two ends 47 and 48 are considerably longer than the back ends 47 passing through the pin plate. One of the connector pins 26' arranged preferably within the corner area of each pin plate 21-24 has an extended back end 47' which in the folded final state of pin plates 21 to 24 protrudes into a through hole 46' with a smaller diameter in base plate 41. The diameter dimensions of pin end 47' and of through hole 46' are such that in the plugged-in state a kind of releasable push-button connection is achieved. In this manner, each pin plate 21 to 24 can be releasably locked with base plate 41, the back of pin plates 21 to 24 being placed directly against the lower side of base plate 41.

Base plate 41 is used as a positioning means of pin plates 21 to 24, and to make sure that all pins 26 are arranged in the correct raster spacing relative to each other, so that module 11 can be received by the next package, e.g. a card.

As shown in the left-hand part of FIG. 2, the length of connector elements 29 between pin plates 21 to 24 and substrate 12 is such that pin plates 21 to 24 can easily be folded round base plate 41 downward beneath substrate 12 and around all four peripheral sections of base plate 41, so that beneath substrate 12 connector pins 26 protrude distributed over a surface roughly corresponding to that surface which is available as a chip 13 receiving surface on substrate 12.

Component 39 is a cooling element which with its correspondingly shaped internal surface 51 is deposited on traction relief frame 30, base plate 41 and substrate 12, and which with a surrounding protective ledge 52 covers connector elements 29. In a manner not shown, cooling element 39 is fixed to component 38. Cooling element 39 is equipped with external cooling fins 53 and is made of one piece. It ensures a traction relief for flexible connector elements 29 as well as mechanical protection for substrate 12. Cooling element 39 may consist of several parts, with the part facing substrate 12 being advisably made of one piece with the size and area of substrate 12, for the reasons specified above.

Base plate 41 and/or connector pins 26 can obviously be used as cooling elements, too.

Furthermore, pin plates 21 to 24 can be folded upwards in accordance with FIG. 2, with the longer pin ends 48 always protruding outward from module 11.

Although the drawing in accordance with a preferred embodiment depicts a square substrate 12, it is obvious that substrate 12 can have the shape of any kind of polygon. For forming pin plates 21 to 24 a polygonal substrate surface can be divided into a discretionary number of polygonal individual surfaces (with a correspondingly smaller amount of corners) which when composed, i.e. in the final folded state, supplement each other to form the respective polygon of substrate 12. Each preferably straight-lined peripheral section of substrate 12 should preferably have an associated pin plate 21 of respective triangular shape, if necessary of a partly different size.

We claim:

1. An electronic package comprising:

a substantially planar substrate having a plurality of conductors located thereon, said substrate of a predetermined shape and having a plurality of sides;

a plurality of integrated circuit chips located on said planar surface, said chips being electrically and mechanically connected to said conductors located on said substrate;

a plurality of pin plate members each including an electrically insulating material having a plurality of connector pins located therein, each of said pin plate members being foldable with respect to one of said sides of said substrate and of a preestablished shape different than said shape of said substrate, said pin plate members combining to form shape substantially similar in configuration and size as said substrate when so folded;

a plurality of connector elements each electrically coupling a respective one of said pin plate members to said integrated circuit chips, each of said connector elements including a flexible carrier and electrical conductors located thereon to thereby form a flexible connection between each of said pin plate members and said substrate, each of said flexible carriers being secured to said substrate along a respective one of said sides thereof; and at least one base plate member defining a recess within one surface thereof for receiving said planar substrate and said integrated circuit chips therein and a plurality of openings within an opposite surface thereof each designed for accommodating a respective one of said connector pins therein when said pin plate members are folded.

2. The electronic package according to claim 1 wherein each of said pin plate members is releasably locked within said base plate member.

3. The electronic package according to claim 2 wherein each of said pin plate members includes at least one pin having an extended end and said base plate includes at least one hole therein adapted for having a respective one of said extended ends of said pins protruding therein, said extended ends being located within said holes when said pin plate members are folded to provide said releasable locking of said pin plate members.

4. The electronic package according to claim 1 wherein the number of said pin plate members is four, said planar substrate being of substantially square shape and each of said pin plate members being of substantially triangular shape.

5. The electronic package according to claim 1 further including a frame member located on said base plate member and substantially surrounding said planar substrate, said frame member clamping each of said connector elements therein.

6. The electronic package according to claim 5 wherein said base plate member includes a groove therein, said frame member being positioned within said groove.

7. The electronic package according to claim 1 further including a cooling member located on said base plate member.

8. The electronic package according to claim 7 wherein said cooling member includes a surrounding ledge thereon, said ledge substantially covering said connector elements when said pin plate members occupy said folded position with respect to said substrate.

* * * * *